(12) United States Patent
Aoki et al.

(10) Patent No.: US 6,489,671 B2
(45) Date of Patent: Dec. 3, 2002

(54) SEMICONDUCTOR INTEGRATED CIRCUIT HAVING THREE-DIMENSIONAL INTERCONNECTION LINES

(75) Inventors: Yoshio Aoki, Yamanashi (JP); Yutaka Mimino, Yamanashi (JP); Osamu Baba, Yamanashi (JP); Muneharu Gotoh, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/084,921

(22) Filed: Mar. 1, 2002

(65) Prior Publication Data

US 2002/0140088 A1 Oct. 3, 2002

(30) Foreign Application Priority Data

Mar. 30, 2001 (JP) ........................................ 2001-099958

(51) Int. Cl.[7] .............................................. H01L 23/52
(52) U.S. Cl. ........................ 257/691; 257/758; 257/728
(58) Field of Search ................................. 257/664, 691, 257/758, 604, 482, 750, 728

(56) References Cited

U.S. PATENT DOCUMENTS

| | | | | |
|---|---|---|---|---|
| 5,300,798 A | * | 4/1994 | Yamazaki et al. | |
| 5,789,807 A | * | 8/1998 | Correale, Jr. | |
| 5,973,554 A | * | 10/1999 | Yamasaki et al. | |
| 6,034,433 A | * | 3/2000 | Beatty | |
| 6,100,573 A | * | 8/2000 | Lu et al. | |
| 6,175,161 B1 | * | 1/2001 | Goetz et al. | |

* cited by examiner

*Primary Examiner*—Sheila V. Clark
(74) *Attorney, Agent, or Firm*—Armstrong, Westerman & Hattori, LLP.

(57) ABSTRACT

A semiconductor integrated circuit has a 3-dimmensional interconnection line structure for high-speed operation. One aspect of the present invention, there is provided a monolithic microwave integrated circuit (MMIC) having a 3-dimmensional tournament tree shaped multilayer interconnection lines, wherein a single electric feeding point on a top surface of the MMIC is divided, layer by layer, into plural electrodes on the semiconductor substrate of the MMIC via a plurality of laminated interconnection layers and vertical interconnection layers therebetween shaped like a tournament tree.

20 Claims, 5 Drawing Sheets

SEMICONDUCTOR INTEGRATED CIRCUIT HAVING THREE-DIMENSIONAL INTERCONNECTION LINES

BACKGROUND OF THE INVENTION

1. Field of the Invention

The present invention relates to a semiconductor integrated circuit for high-speed operation, and more particularly, to three-dimensional interconnection wiring structure forming the semiconductor integrated circuit.

2. Description of the Related Art

Monolithic Microwave Integrated Circuit (MMIC) for comprising high frequency devices such as a High Electron Mobility Transistor (HEMT) or a Hetero-junction Bipolar Transistor (HBT), unlike a conventional silicon integrated circuit, needs high frequency wave guides for its interconnection lines. A microstrip line has been conventionally used for high frequency interconnection lines because it has stable wiring characteristics and low dispersion characteristics which means that frequency dependence of propagation constant is weak. FIG. 1 is a cross-sectional view of a high frequency wave-guide for a 3-dimensional MMIC of prior art, particularly using multilayer microstrip lines. As shown in FIG. 1, the multilayer MMIC of prior art has a grounded plate 3 on a surface insulating layer 2 formed on the surface of a semiconductor substrate, and the grounded plate 3 is coupled with each of interconnection layers 5 formed on the respective insulating layers 4 to form the respective microstrip lines. The multilayer MMIC of prior art has an advantage in high-density integration over a usual MMIC having interconnection lines laid out on a single plane. However, signal propagation time in the high frequency interconnection lines depends significantly upon not only effective length of interconnection layers but also geometrical relationship with each other, particularly between the interconnection layers and the grounded plate. Therefore, it is not easy to feed an identical signal from a single node to plural nodes with identical timing. Nevertheless, there has been no report on multilayer interconnection lines for high frequency signals in consideration for signal timing. Additionally, it is not allowed that any conductive layer is laid out between the grounded plate and a microstrip line coupled therewith, which considerably restricts freedom of circuit layout design for high-density integration.

SUMMARY OF THE INVENTION

Accordingly, it is an object of this invention to provide an MMIC having a 3-dimmensional tournament tree shaped multilayer interconnection lines, whereby a single electric signal on the uppermost interconnection layer can be fed to plural electrodes on the lowest interconnection layer with identical timing.

It is a further object of this invention to provide a 3-dimmensional MMIC having a smaller chip area with the same design rule and higher speed operation than prior art, in which electric feeding lines are allowed to overlap other interconnection layers.

In accordance with the stated objects, one aspect of the present invention is a multilayer interconnection structure for a 3-dimmensional MMIC, in which a semiconductor device for high frequency operation comprises a semiconductor substrate having an insulating layer on the surface thereof, a grounded plate formed on the semiconductor substrate connecting to a ground potential, a plurality of laminated interconnection layers formed on the grounded plate, the plurality of laminated interconnection layers being insulated from each other and also the grounded plate by insulating layers therebetween, and a vertical interconnection layer for connecting each immediately opposed upper and lower pair of the plurality of laminated interconnection layers in a through-hole penetrating the corresponding one of the insulating layers therebetween, the vertical interconnection layer being disposed at an electric center point of each of the plurality of laminated interconnection layers on a first surface of the corresponding one of the plurality of laminated interconnection layers, and at each end of the corresponding one of the plurality of laminated interconnection layers on a second surface of the corresponding one of the plurality of laminated interconnection layers opposing to the first surface.

BRIEF DESCRIPTION OF THE DRAWINGS

The present invention will be more apparent from the following description, when taken to conjunction with the accompanying drawings, in which.

DESCRIPTION OF THE PREFERRED EMBODIMENT

Embodiment 1

Figure 1:
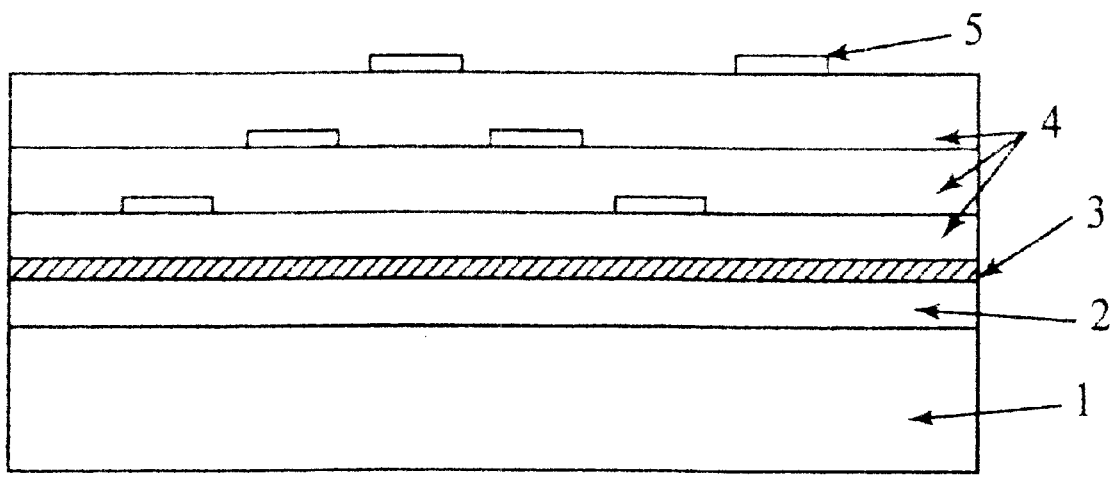
FIG. 1 is a cross-sectional view of a high frequency wave-guide for a 3-dimensional MMIC of prior art.
Figure 2:
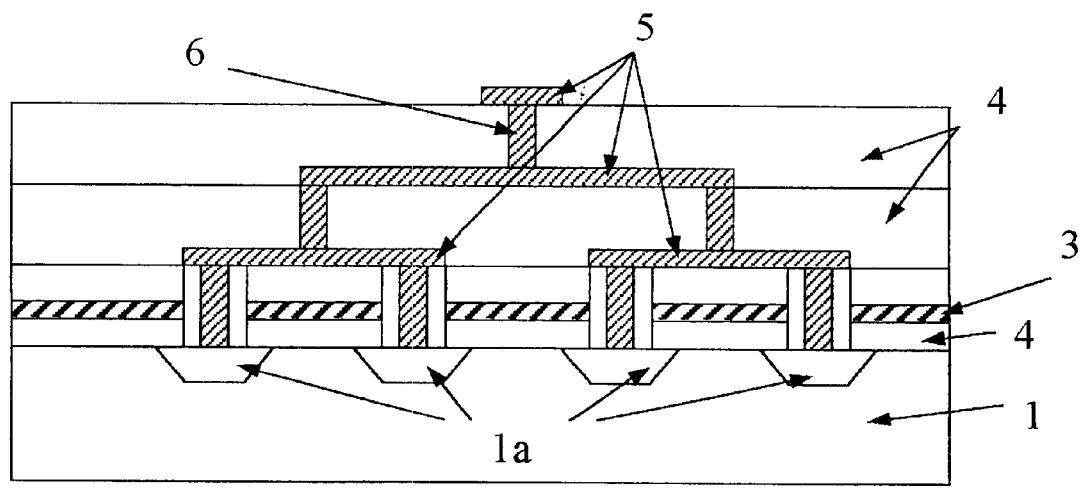
FIG. 2 is a cross-sectional view of a high frequency wave-guide for a 3-dimensional MMIC for the first embodiment according to the present invention.

FIG. 2 is a cross-sectional view of a high frequency wave-guide for a 3-dimensional MMIC for the first embodiment according to the present invention.

Referring to FIG. 2, each of the interconnection layers 5 is formed on the corresponding insulating layer 4 by dividing them thereon, layer by layer, from the upper layer to the lower layer, in which the upper layer is connected to the lower layer via a vertical interconnection layer 6 at an electrical center point of the lower interconnection layer 5 in a tournament tree shape. According to this multilayer structure of the present invention, an electric signal inputted in the uppermost interconnection layer 5 can be fed to each of the active regions 1a (four regions in FIG. 2) in the semiconductor substrate in identical timing. If the interconnection layer is laid out on a single plane shaped like a tournament tree written on a sheet of paper in which each branch of the interconnection layer has identical length, it is necessary to form a straight and long vertical interconnection layer from each end point of the interconnection layers on the uppermost surface to the corresponding active region on the deepest surface by penetrating all of the insulating layers therebetween in order to feed a single electric signal to each of the active regions in identical timing. However, since numbers of insulating layers increases based on increasing of device functions in a recent 3-dimmensional MMIC, it takes a lot of etching-time to form long through-holes penetrating many numbers of insulating layers, and further, it is also very difficult to plug metal in the long through-holes uniformly without voids. In contrast, in the present invention, even if the number of the insulating layers increases, each of the through-holes does not increase in depth because the interconnection layers are divided in the depth direction. Needless to say, in the present invention, a long through-hole penetrating many numbers of insulating layers can be formed by connecting short through-holes layer by layer.

Embodiment 2

Figure 3:
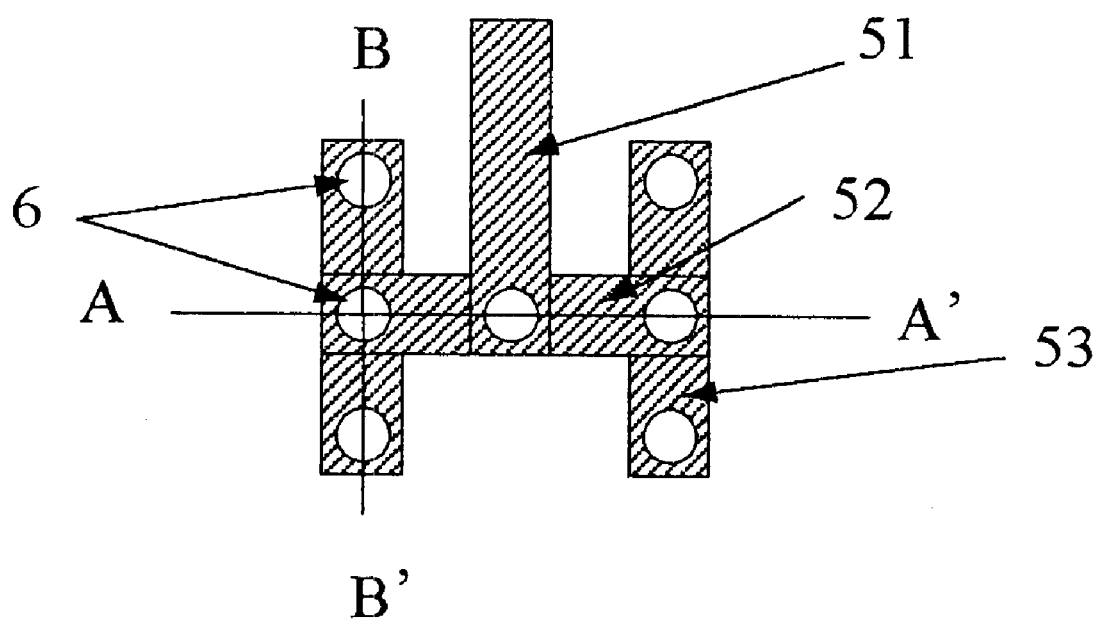
FIG. 3 is a see-through plan view of a 3-dimensional MMIC for the second embodiment according to the present invention.

FIG. 3 is a see-through plan view of a 3-dimensional MMIC for the second embodiment according to the present invention.

Figure 4:
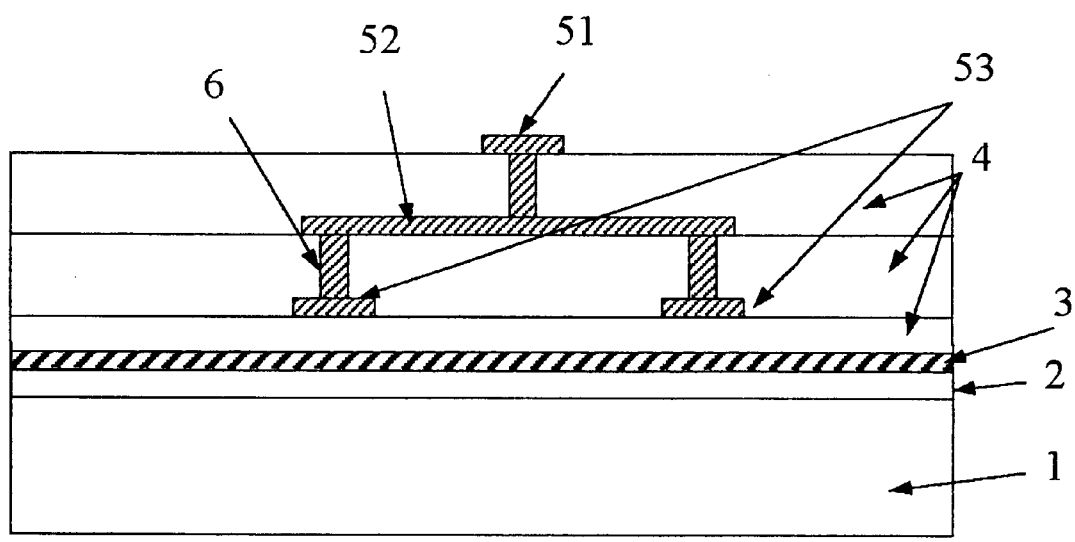
FIG. 4 is a cross-sectional view of the 3-dimensional MMIC along A–A' line shown in FIG. 3.

FIG. 4 is a cross-sectional view of the 3-dimensional MMIC along A–A' line shown in FIG. 3.

Figure 5:
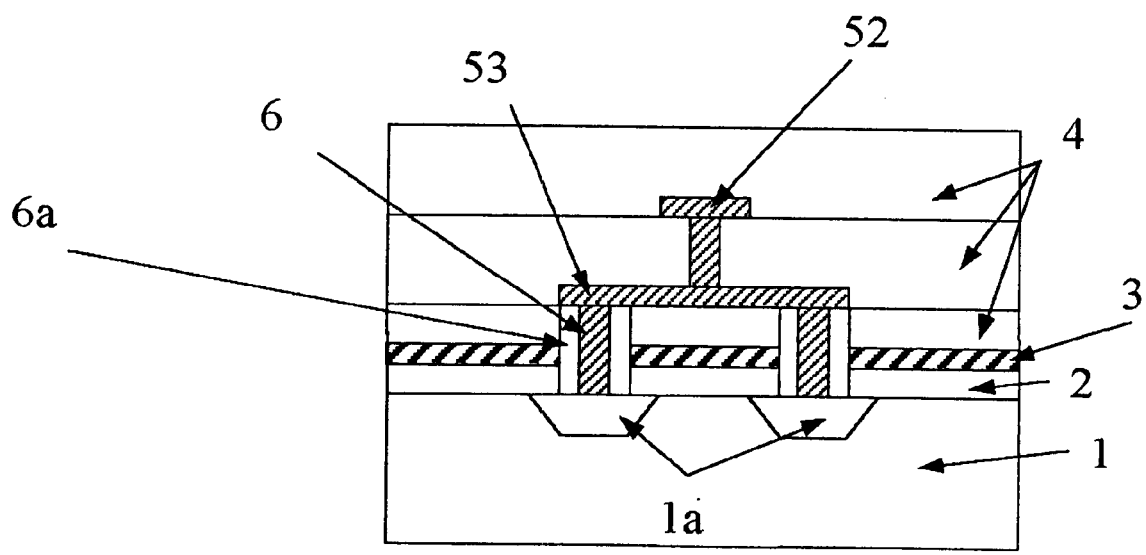
FIG. 5 is a cross-sectional view of the 3-dimensional MMIC along B–B' line shown in FIG. 3.

FIG. 5 is a cross-sectional view of the 3-dimensional MMIC along B–B' line shown in FIG. 3.

In this embodiment, as shown in FIG. 4, an electric signal or power is provided from the first interconnection layer 51 on the uppermost layer to each of active regions of an FET through the second interconnection layer 52 on the lower layer and the third interconnection layer 53 on the further lower layer. The insulating layer is made of resin insulating layer having low dielectric constant such as polyimide or benzocyclobutane (BCB). The surface insulating layer 2 on the semiconductor substrate 1 is made of a stable insulating layer such as silicon nitride. Since length of the interconnection layers is identical with each other by forming each of the through-holes 6 in the corresponding electrical center points of the second and third interconnection layers, it can be possible to provide a signal to each of the active regions 1a in the same timing.

As shown in FIG. 3, the laminated interconnection layers are laid out in perpendicular to each other between the upper layer and the lower layer directly opposing to the upper layer. As shown in FIG. 4, the second interconnection layer 52 connected to the first interconnection layer 51 is connected to the third interconnection layer 53 by the vertical interconnection layer 6 formed at both ends of the second interconnection layer 52. As shown in FIG. 5, the third interconnection layer 53 is connected to each of the active regions 1a at both ends of the third interconnection layer 53. Additionally, since the grounded plate 3 is exposed to the through-holes, a through-hole insulating layer 6a is formed on each inside-wall of the through-holes. Another important advantage of these embodiments other than to feed a signal to each of the active regions in identical timing is that the first, second and third interconnection layers are overlapped to each other only at each point of the through-holes. To form the microstrip lines in a 3-dimmensional MMIC of prior art, it is desirable that each of the horizontal interconnection layers vertically opposes the corresponding grounded plate 3, and that no other conductors are disposed between them. In comparison with the prior art, it is obvious that the embodiments on the present invention have better signal propagation characteristics because overlapping occurs only at each of the through-holes.

Although only the foregoing embodiments of the present invention have been disclosed on a typical electric feeding line structure, it will be obvious to those having ordinary skill in the art, that changes and modifications may be made thereto without departing from the spirit and the scope of the invention as hereinafter claimed. For instance, feeding signals with identical timing according the present invention can be favorable to a power field effect transistor (FET). Since the power FET usually has many parallel structures including gate, source and drain electrodes, it is important to provide input or output signals to these parallel electrodes at the same timing for parallel operation. Thus, the parallel operation is facilitated by applying the present invention to these parallel electrodes for gate, source and drain. Although the disclosed embodiments illustrate the interconnection lines divided layer by layer from upper to lower layers, it is also possible that the interconnection lines are divided layer by layer from lower to upper layers in the reverse direction, by which plural electronic potentials can be supplied consolidatedly to a single active region (or an electronic potential can be divided from the single active region to the plural interconnection lines). Needless to say, the present invention can apply to not only the active region of an active device such as the semiconductor device but also passive devices such as a capacitive, inductive or resistive device. Furthermore, those passive devices can be formed by conductors between insulating layers as well as on a semiconductor substrate.

What is claimed is:

1. A semiconductor device for high frequency operation comprising:

a semiconductor substrate having a surface insulating layer on the surface thereof;

a grounded plate formed on the surface insulating layer connecting to a ground potential;

a plurality of laminated interconnection layers formed on said grounded plate, said plurality of laminated interconnection layers being insulated from each other and said grounded plate by insulating layers therebetween; and a vertical interconnection layer for connecting each immediately opposed upper and lower pair of said plurality of laminated interconnection layers via a through-hole penetrating the corresponding one of the insulating layers therebetween, said vertical interconnection layer being disposed at an electrically central point of each of said plurality of laminated interconnection layers on a first surface of the corresponding one of said plurality of laminated interconnection layers, and at each end of the corresponding one of said plurality of laminated interconnection layers on a second surface of the corresponding one of said plurality of laminated interconnection layers opposing to the first surface.

2. The semiconductor device according to claim 1, wherein the first surface of each of said plurality of laminated interconnection layers is the upper surface of the corresponding one of said plurality of laminated interconnection layers, and the upper surface is remoter from said semiconductor substrate than the lower surface.

3. The semiconductor device according to claim 1, wherein the first surface of each of said plurality of laminated interconnection layers is the lower surface of the corresponding one of said plurality of laminated interconnection layers, and the lower surface is nearer to said semiconductor substrate than the upper surface.

4. The semiconductor device according to claim 1, wherein each immediately opposed upper and lower pair of said plurality of laminated interconnection layers is laid out such that the upper layer of the pair crosses over the lower layer.

5. The semiconductor device according to claim 1, wherein the insulating layers are made of resin material.

6. The semiconductor device according to claim 5, wherein the resin material is polyimide or benzocyclobutane.

7. The semiconductor device according to claim 1, further comprising an active region formed on said semiconductor substrate, said active region being connected to said plurality of laminated interconnection layers.

8. The semiconductor device according to claim 7, wherein said active region is connected to said plurality of laminated interconnection layers by each of electrodes for gate, drain and source formed on said active region.

9. The semiconductor device according to claim 8, wherein a plurality of the electrodes for gate, drain and source are interdigitated with each other and a plurality of the respective electrodes for gate, drain and source are consolidated into the respective single electric feeding point via said plurality of laminated interconnection layers and said vertical interconnection layers therebetween.

10. The semiconductor device according to claim 1, further comprising a passive device, said passive device being connected to said plurality of laminated interconnection layers.

11. The semiconductor device according to claim 10, wherein said passive device is a capacitive, inductive or, resistive device.

12. The semiconductor device according to claim 10, wherein said passive device has a member including a part of said plurality of laminated interconnection layers.

13. The semiconductor device according to claim 4, wherein the upper layer crosses over the lower layer only at a disposition of said vertical interconnection layer formed therebetween.

14. The semiconductor device according to claim 2, wherein a single electric feeding point on a top surface of said plurality of laminated interconnection layers are divided into plural electrodes on said semiconductor substrate layer by layer via said plurality of laminated interconnection layers and said vertical interconnection layers therebetween shaped like a tournament tree.

15. The semiconductor device according to claim 3, wherein plural electric feeding points on a top surface of said plurality of laminated interconnection layers are consolidated into a single electrode on said semiconductor substrate layer by layer via said plurality of laminated interconnection layers and said vertical interconnection layers therebetween shaped like an upside-down tournament tree.

16. The semiconductor device according to claim 1, wherein said vertical interconnection layer connected to said active region by penetrating said grounded plate is insulated from said grounded plate by a through-hole insulating layer formed on an inside wall of the through-hole.

17. The semiconductor device according to claim 1, wherein said surface insulating layer on the semiconductor substrate is made of silicon nitride.

18. The semiconductor device according to claim 5, wherein the resin material has low dielectric constant.

19. The semiconductor device according to claim 1, wherein the semiconductor device is a power field effect transistor.

20. The semiconductor device according to claim 19, wherein the power field effect transistor has many parallel structures including gate, source and drain electrodes.

* * * * *